(12) United States Patent
Kim et al.

(10) Patent No.: US 7,414,324 B2
(45) Date of Patent: Aug. 19, 2008

(54) WAFER STRUCTURE WITH MIRROR SHOT

(75) Inventors: Young-dae Kim, Seoul (KR);
Dae-young Kim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 11/543,187

(22) Filed: Oct. 4, 2006

(65) Prior Publication Data

US 2007/0091328 A1    Apr. 26, 2007

(30) Foreign Application Priority Data

Oct. 21, 2005    (KR) .................. 10-2005-0099617

(51) Int. Cl.
*H01L 23/544* (2006.01)
(52) U.S. Cl. ...................... 257/797; 257/798
(58) Field of Classification Search .......... 257/798, 257/797
See application file for complete search history.

(56) References Cited

U.S. PATENT DOCUMENTS

| | | | |
|---|---|---|---|
| 6,015,750 A * | 1/2000 | Bruce et al. .......... | 438/636 |
| 6,180,498 B1 * | 1/2001 | Geffken et al. ........ | 438/462 |
| 6,501,188 B1 * | 12/2002 | Stanton et al. ......... | 257/797 |
| 7,067,931 B1 | 6/2006 | Leroux | |

FOREIGN PATENT DOCUMENTS

| | | |
|---|---|---|
| JP | 11-067876 | 3/1999 |
| JP | 2002-026041 | 1/2002 |
| JP | 2002-312933 | 10/2002 |
| JP | 2005-093461 | 4/2005 |

* cited by examiner

*Primary Examiner*—Roy K Potter
(74) *Attorney, Agent, or Firm*—Mills & Onello LLP

(57) ABSTRACT

A wafer structure with mirror shot is provided. A wafer structure according to the present invention comprises a first mirror shot area to which a mirror shot is applied, wherein the position of a first die is searched for based on the first mirror shot area. The wafer structure further comprises a second mirror shot area to which the mirror shot is applied. The second mirror shot area is located diagonally with respect to the first mirror shot area.

20 Claims, 2 Drawing Sheets

US 7,414,324 B2

WAFER STRUCTURE WITH MIRROR SHOT

CROSS-REFERENCE TO RELATED PATENT APPLICATIONS

This application claims the benefit of Korean Patent Application No. 10-2005-0099617, filed on Oct. 21, 2005, in the Korean Intellectual Property Office, the contents of which are incorporated herein in their entirety by reference.

BACKGROUND OF THE INVENTION

1. Field of the Invention

The present invention relates to a wafer structure, and more particularly, to a wafer structure in which a mirror shot is performed for a partial area of a wafer for stable die attachment.

2. Description of the Related Art

For semiconductor circuit devices that are assembled after a test is completed, a good die and a bad die are accurately classified only by recognition of the presence of inking, and die attachment is performed only for the good die. The inking is performed to classify a good die and a bad die by marking a surface of each die using ink. As wafer sizes increase and become thin, inking is omitted and accordingly a probability of generation of defects during the die attachment operation increases.

When die attachment is performed by configuring a wafer map with a full shot without inking, a first die is recognized and a good die is selected based on the recognized first die so that the die attachment is performed. That is, instead of inking, the first die that works as a reference coordinate is recognized, and the good die and the bad die are searched to use its coordinate to perform the die attachment operation.

However, since there is no specific reference in recognition of the first die, an error can occur in the coordinate of the first die so that the good die attachment performed based on the first die coordinate may be defective. That is, instead of the good die, the bad die can be attached. Thus, a method for accurately recognizing the position of the first die is needed for the good die attachment.

SUMMARY OF THE INVENTION

To solve the above and/or other problems, the present invention provides a wafer structure which enables stable die attachment while avoiding a die attachment defect.

According to an aspect of the present invention, a wafer structure comprises a first mirror shot area to which a mirror shot is applied, wherein the position of a first die is searched for based on the first mirror shot area.

In one embodiment, the wafer structure further comprises a second mirror shot area to which the mirror shot is applied. The second mirror shot area can be located diagonally with respect to the first mirror shot area.

In one embodiment, the first die is located in proximity to one of the first mirror shot area and the second mirror shot area.

In one embodiment, a metal mirror is applied to at least one of the first and second mirror shot areas. The metal mirror can be formed of a top metal layer or a lower metal layer.

In one embodiment, at least one of the first and second mirror shot areas is a labeling area.

In one embodiment, at least one of the first and second mirror shot areas has an area greater than a single die.

The wafer of the wafer structure can include a flat zone, and in the wafer a full shot is performed. The wafer of the wafer structure can include a notch, and in the wafer a full shot is performed.

According to another aspect, the invention is directed to a wafer structure comprising a first mirror shot area adjacent to a first die and a second mirror shot area located diagonally with respect to the first mirror shot area.

In one embodiment, the wafer of the wafer structure includes a flat zone, and in the, wafer a full shot is performed.

In one embodiment, the wafer of the wafer structure includes a notch, and in the wafer a full shot is performed.

In one embodiment, a metal mirror is applied to at least one of the first and second mirror shot areas. The metal mirror can be formed of a top metal layer or a lower metal layer. At least one die is in one of the first and second mirror shot areas.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
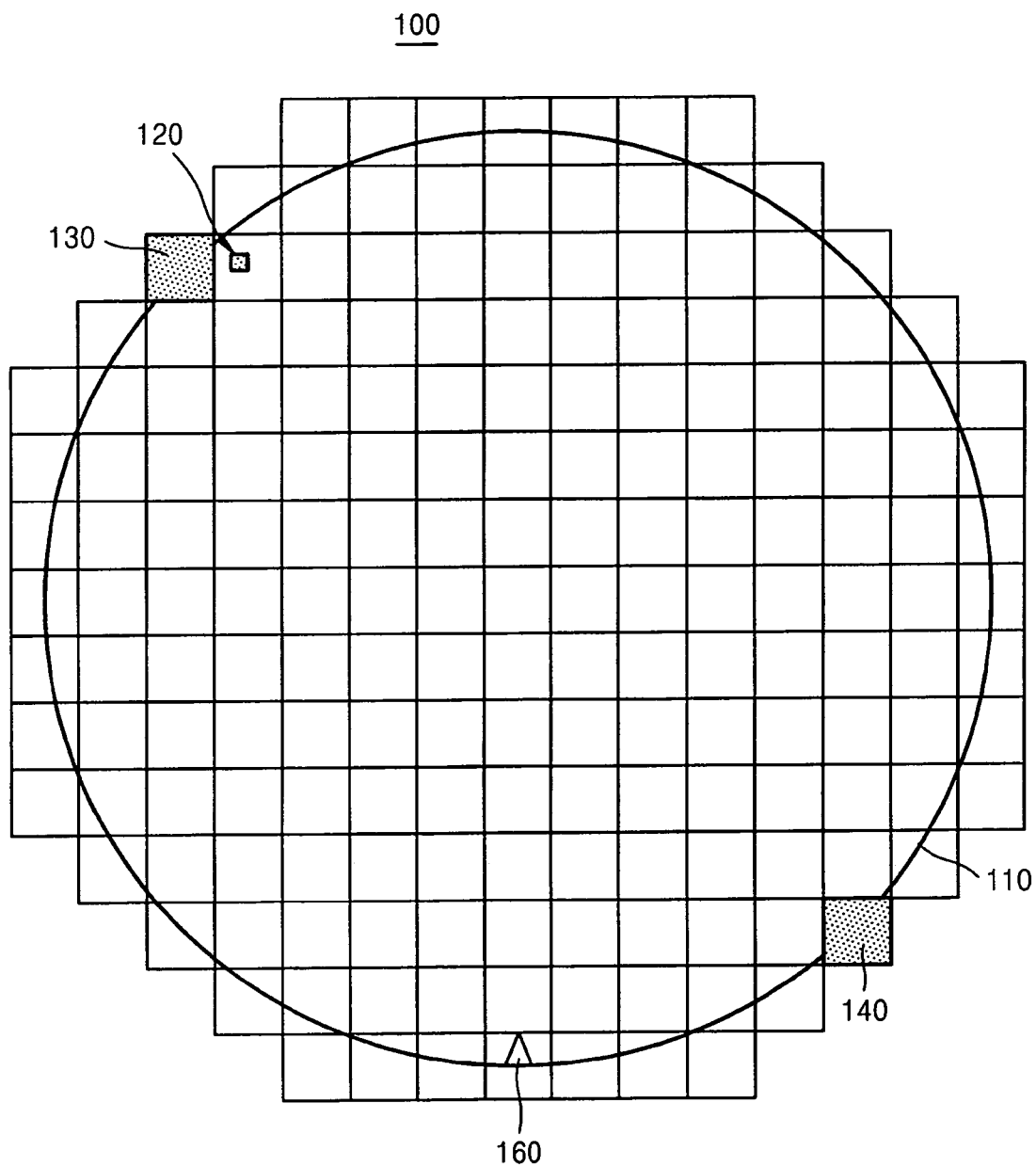
FIG. 1 is a view showing a wafer structure according to an embodiment of the present invention.

FIG. 1 is a view showing a wafer structure according to an embodiment of the present invention. In the wafer structure 100 of FIG. 1, wafer 110 is a notch wafer. However, according to the invention other types of wafer may be used in the wafer structure 100 of FIG. 1. Referring to FIG. 1, a wafer structure 100 according to an embodiment of the present invention includes a first mirror shot area 130 to which a mirror shot is applied. The position of a first die 120 is searched for based on the first mirror shot area 130.

The first die 120 is a die used as a reference coordinate in attaching a good die. A wafer structure 100 of FIG. 1 may further include a second mirror shot area 140 to which a mirror shot is applied. The first die 120 may be located in proximity to or at a portion adjacent to the first mirror shot area 130 as shown, and the first mirror shot area 130 and the second mirror shot area 140 may be diagonally located with respect to each other, as shown. Although the first die 120 is located adjacent to the first mirror shot area 130 in FIG. 1, the first die 120 can be located around or in proximity to the second mirror shot area 140.

When die attachment is performed without inking, die attachment equipment can accurately find the position of the first die 120 from the first mirror shot area 130 and the second mirror shot area 140 which are different from the full shot applied to the wafer 110. As the position of the first die 120 is accurately determined, a good die is accurately found based on the first die 120 so that the die attachment can be carried out accurately.

According to the invention, the first mirror shot area 130 and the second mirror shot area 140 not necessarily located diagonally with respect to each other. However, when the first mirror shot area 130 and the second mirror shot area 140 are diagonally located, the determination of the position of the first die 120 can be more accurate.

When the wafer 110 is a notch wafer, the position of the first die 120 can be accurately determined based on the position of a notch 160 and one of the first and second mirror shot areas 130 and 140. The first and second mirror shot areas 130 and 140 may be metal mirrors formed of a metal layer and one of the mirror shot areas 130 and 140 does not need to be the metal mirror.

The metal layer used for the metal mirror may be a final metal layer on the wafer, for example, a top metal layer or a lower metal layer. When a relatively large number of metal layers are used, a problem of height with respect to an adjacent die must be taken into consideration. At least one of the first and second mirror shot areas 130 and 140 can be a labeling area.

The size of a mirror shot is larger than that of a single die and at least one mirror shot area is larger than the size of a single die. When the mirror shot area is set as described above, the loss of a good die due to a mirror shot in products to which a full shot is performed can be minimized.

Figure 2:
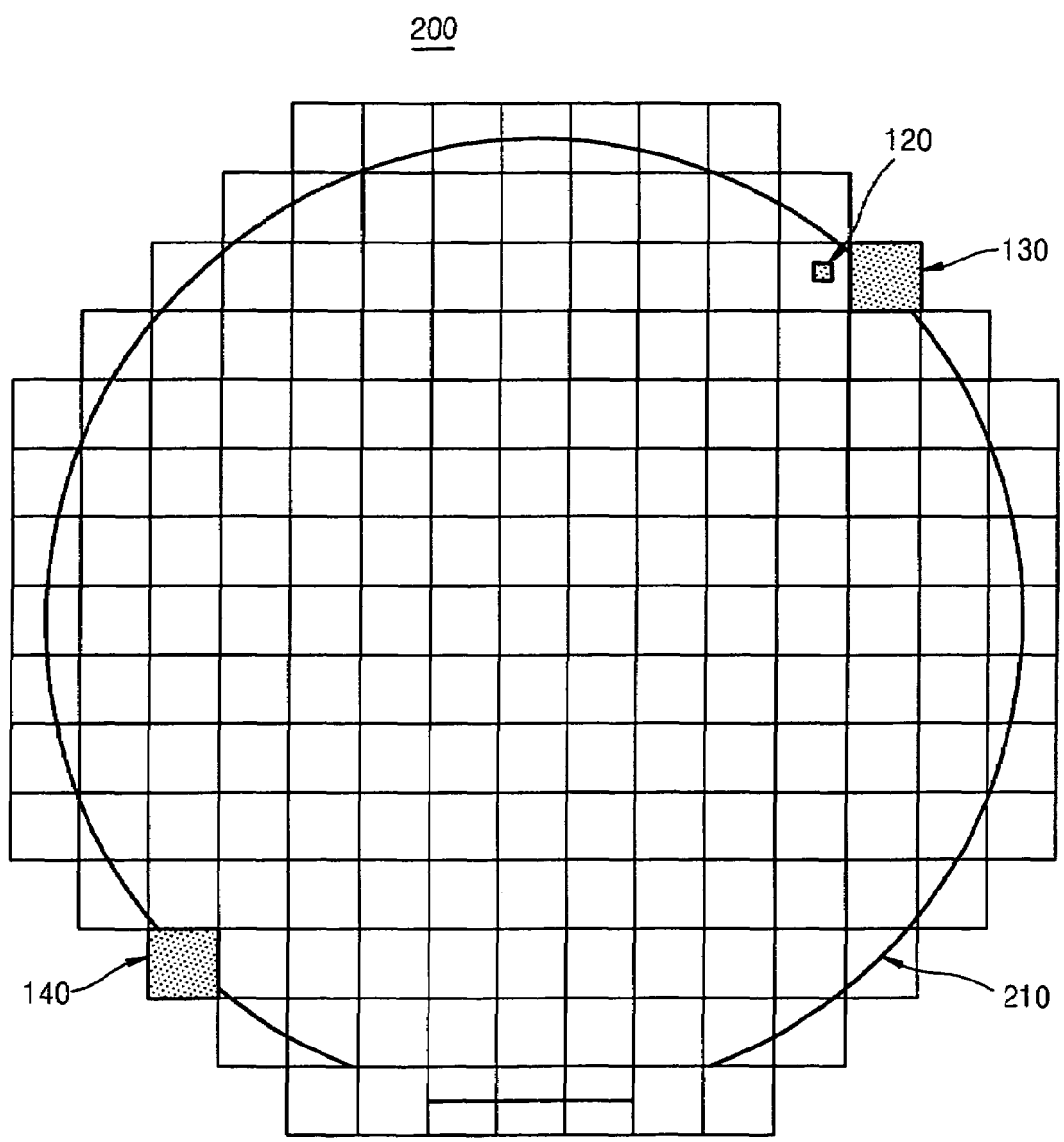
FIG. 2 is a view showing a wafer structure according to another embodiment of the present invention.

FIG. 2 is a view showing a wafer structure according to another embodiment of the present invention. Referring to FIG. 2, a wafer structure 200 according to another embodiment of the present invention, in which a wafer 210 having a flat zone is processed with a full shot, includes the first die 120, the first mirror shot area 130, and the second mirror shot area 140.

The first mirror shot area 130 may be located around or in proximity to the first die 120 as shown, and the second mirror shot area 140 may be located diagonally with respect to the first mirror shot area 130 as shown. As in the above embodiment shown in FIG. 1, die attachment is carried out by finding the position of the first die 120 from at least one of the first mirror shot area 130 and second mirror shot area 140. The wafer structure 200 of FIG. 2 is similar to the wafer structure 100 of FIG. 1 except that the flat zone wafer 210 is used in the wafer structure 200. Therefore, detailed description of the wafer structure 200 will not be repeated.

According to the present invention, die attachment is stably carried out by performing a mirror shot to the wafer 110, 210 with the full shot. The wafer structure 100, 200 according to the present invention includes the first mirror shot area 130 and the second mirror shot area 140 in the notch wafer 110 of FIG. 1 or the flat zone wafer 210 of FIG. 2 with the full shot, so that the position of the first die 120 is accurately recognized. Thus, during the die attachment operation, the die attachment equipment can accurately attach a good die.

According to the present invention, without change of the die attachment equipment, the inkless die attachment of a wafer is stably carried out so that the yield is improved.

As described above, the wafer structure according to the present invention accurately recognizes the first die using the first and second mirror shot areas so that defects in die attachment due to an error in the recognition of the first die can be reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A wafer structure comprising:
   a wafer;
   a first mirror shot area disposed to receive a mirror shot; and
   a first die located at a distance relative to the first mirror shot area,
   wherein the first mirror shot area at least partially defines a reference for determining positions of specific dies on the wafer.

2. The wafer structure as claimed in claim 1, further comprising:
   a second mirror shot area disposed to receive the mirror shot.

3. The wafer structure as claimed in claim 2, wherein the second mirror shot area is located diagonally with respect to the first mirror shot area.

4. The wafer structure as claimed in claim 2, wherein the first die is located in proximity to one of the first mirror shot area and the second mirror shot area.

5. The wafer structure as claimed in claim 2, wherein a metal mirror is applied to at least one of the first and second mirror shot areas.

6. The wafer structure as claimed in claim 5, wherein the metal mirror is formed of a top metal layer or a lower metal layer.

7. The wafer structure as claimed in claim 2, wherein at least one of the first and second mirror shot areas is a labeling area.

8. The wafer structure as claimed in claim 2, wherein at least one of the first and second mirror shot areas has an area greater than a single die.

9. The wafer structure as claimed in claim 2, wherein the wafer of the wafer structure includes a flat zone, the wafer configured to receive a full shot.

10. The wafer structure as claimed in claim 2, wherein the wafer of the wafer structure includes a notch, and in the wafer a full shot is performed.

11. A wafer structure comprising:
    a wafer;
    a first mirror shot area adjacent to a first die; and
    a second mirror shot area located diagonally to the first mirror shot area,
    wherein the first mirror shot area at least partially defines a reference for determining positions of specific dies on the wafer.

12. The wafer structure as claimed in claim 11, wherein the wafer of the wafer structure includes a flat zone, the wafer configured to receive a full shot.

13. The wafer structure as claimed in claim 11, wherein the wafer of the wafer structure includes a notch, and in the wafer a full shot is performed.

14. The wafer structure as claimed in claim 11, wherein a metal mirror is applied to at least one of the first and second mirror shot areas.

15. The wafer structure as claimed in claim 14, wherein the metal mirror is formed of a top metal layer or a lower metal layer.

16. The wafer structure as claimed in claim 15, wherein at least one die is in one of the first and second mirror shot areas.

17. A wafer structure comprising:
    a wafer;
    a first mirror shot area as a first reference structure; and
    a second reference structure,
    wherein the first and second references structures define a coordinate system for locating dies formed on the wafer.

18. The wafer structure as claimed in claim 17, wherein the second reference structure includes a second mirror shot area.

19. The wafer structure as claimed in claim 17, wherein the second reference structure includes a notch in the wafer.

20. The wafer structure as claimed in claim 17, wherein the second reference structure includes a flat zone in the wafer.

* * * * *